US010753987B2

United States Patent
McGee et al.

(10) Patent No.: US 10,753,987 B2
(45) Date of Patent: Aug. 25, 2020

(54) DETECTOR ACCESS CHAMBER

(71) Applicant: NAL Limited, Worcester, Worcestershire (GB)

(72) Inventors: Michael McGee, Worcester (GB); Feargal O'Connell, Worcester (GB)

(73) Assignee: NAL Limited, Worcestershire (GB)

( * ) Notice: Subject to any disclaimer, the term of this patent is extended or adjusted under 35 U.S.C. 154(b) by 40 days.

(21) Appl. No.: 15/768,004

(22) PCT Filed: Oct. 14, 2016

(86) PCT No.: PCT/GB2016/053197
§ 371 (c)(1),
(2) Date: Apr. 12, 2018

(87) PCT Pub. No.: WO2017/064510
PCT Pub. Date: Apr. 20, 2017

(65) Prior Publication Data
US 2018/0299515 A1    Oct. 18, 2018

(30) Foreign Application Priority Data
Oct. 15, 2015  (GB) .................................. 1518281.9

(51) Int. Cl.
*G01R 33/00* (2006.01)
*G08G 1/042* (2006.01)
(Continued)

(52) U.S. Cl.
CPC .......... *G01R 33/0047* (2013.01); *E01F 11/00* (2013.01); *G01D 11/24* (2013.01); *G08G 1/042* (2013.01); *G08G 1/01* (2013.01)

(58) Field of Classification Search
CPC .......... G01D 11/24; E01F 11/00; G08G 1/042
See application file for complete search history.

(56) References Cited

U.S. PATENT DOCUMENTS 4,302,746 A * 11/1981 Scarzello ............... G08G 1/042
324/247
5,583,287 A * 12/1996 Lyon .................... G01D 11/245
73/115.06
(Continued)

FOREIGN PATENT DOCUMENTS

CN         203311633 U      11/2013
CN         103810862 A       5/2014
(Continued)

OTHER PUBLICATIONS

International Search Report of International Patent Application No. PCT/GB2016/053197 completed Feb. 6, 2017 dated Feb. 15, 2017 (4 pages).
(Continued)

*Primary Examiner* — Alvaro E Fortich
(74) *Attorney, Agent, or Firm* — Pyprus Pte Ltd

(57) ABSTRACT

A detector access chamber (10) for a wireless directional detector (40), comprises a hollow body (12) having an open a upper end (20) and a lower end (24) at an opposing end, a lid (16) engageable with the open upper end (20) of the body (12) and preferably adapted to accommodate at least a 40 tonne vehicular load, and a detector holder (38) within the body (12) to hold a wireless directional detector (40). In use, the lid (16) and the detector holder (38) together define a volume adapted to constrain internal reorientation of the wireless directional detector (40) caused by vibrations. A submergible detector system (42) is also provided.

18 Claims, 4 Drawing Sheets

(51) Int. Cl.
*E01F 11/00* (2006.01)
*G01D 11/24* (2006.01)
*G08G 1/01* (2006.01)

(56) References Cited

U.S. PATENT DOCUMENTS

| | | | | |
|---|---|---|---|---|
| 5,952,803 A | * | 9/1999 | Canada | G01R 31/343 318/558 |
| 2002/0140422 A1 | | 10/2002 | Bodin et al. | |
| 2005/0270016 A1 | * | 12/2005 | Karanam | G01R 22/065 324/157 |
| 2007/0031084 A1 | * | 2/2007 | Wang | E01F 11/00 385/37 |
| 2008/0136676 A1 | * | 6/2008 | Yano | G01G 19/02 340/937 |
| 2011/0011180 A1 | * | 1/2011 | Wilson | G01D 11/245 73/431 |
| 2013/0063282 A1 | * | 3/2013 | Baldwin | B61L 29/282 340/941 |
| 2014/0159925 A1 | * | 6/2014 | Mimeault | G01S 17/66 340/935 |
| 2014/0240146 A1 | * | 8/2014 | Neel | G08G 1/042 340/933 |
| 2015/0070181 A1 | * | 3/2015 | Fadell | G08B 21/22 340/628 |

FOREIGN PATENT DOCUMENTS

| | | | |
|---|---|---|---|
| CN | 204066396 U | | 12/2014 |
| DE | 3822369 A1 | | 6/1989 |
| JP | 2012058080 A | * | 3/2012 |
| KR | 101014244 | * | 2/2011 ............ G08G 1/017 |
| KR | 101014244 B1 | | 2/2011 |

OTHER PUBLICATIONS

Written Opinion of International Patent Application No. PCT/GB2016/053197 completed Feb. 6, 2017 and dated Feb. 15, 2017 (8 pages).
Search Report of UK patent application No. GB1518281.9 dated Mar. 7, 2016 (1 page).

* cited by examiner

DETECTOR ACCESS CHAMBER

The present invention relates to improvements to a housing for a wireless directional detector and, more particularly but not necessarily exclusively, a magnetometer, used in highway applications to detect and measure vehicle and cycle movements. The invention also relates to a submergible detector system utilising such a housing.

Wireless directional detectors, such as magnetometers, are well known for their use in highway applications to detect and measure vehicle and cycle movements. Such detectors are commonly used to control traffic signals. They must be housed below ground, in the centre of a road highway or traffic lane, to enable the detection of vehicles and cyclists. By directional detector, it is meant a detector, typically for measurement purposes, which must be directionally aligned or oriented in order to correctly function.

Currently available wireless directional detector housings comprise a two-part plastic clamshell container, which clamps tightly around the detector. Once encapsulated, this clamshell container is recessed into the ground, and covered with a black coloured two-part resin; the resin allows the detectors to operate without interference. This configuration makes it expensive and time consuming to remove the detector for maintenance and/or replacement. When the detector requires removal, current practice requires the resin to be broken, for example, with a hammer and screwdriver. This is cumbersome and makes it easy to damage the detector. Once the resin has been cleared, the top half of the clamshell container is removed, allowing the detector to be extracted and replaced. A new top half of the clamshell container is fitted and the resin reapplied and allowed to harden.

The current solution requires full traffic management provisions to be put into place on the highway the work is undertaken upon. The carriageway must be shut down for the duration of the process and cannot be re-opened before the resin has hardened. This is inherently expensive and disruptive for road users.

Critically, installation depth under the current solution is finite. If the detector is installed at too shallow a depth under the carriageway the resin can break up under the weight and movement of the vehicles passing over ground, dislodging the detector and leading to its destruction.

Moreover, the resin blends in with the road construction. Therefore, if a contractor is unaware of a detector's location, they have no way of identifying this. Consequently, if a road or cycleway is resurfaced, the detector can be inadvertently dislodged and/or destroyed by the carriageway planing. Complete replacement and reinstatement is then required, before or after resurfacing works are completed.

It is an object of the present invention to provide a housing for a wireless directional detector so as to obviate one or more of the above-mentioned problems.

According to a first aspect of the invention there is provided a detector access chamber for a wireless directional detector, comprising a hollow body having an open upper end and a lower end at an opposing end, a lid engageable with the open upper end of the hollow body, and a detector holder within the hollow body to hold a wireless directional detector, the lid and the detector holder defining a volume adapted to constrain an orientation of the wireless directional detector.

The detector access chamber is advantageous, because an openable lid is positioned at the upper end of the hollow body, obviating the need to destroy at least part of the housing to access the interior of the chamber.

Ideally, the lid should be positioned flush, or substantially flush, with the surface of the highway. This removes the need to cover the detector access chamber with resin. The lid can be disengaged and replaced quickly, reducing the likelihood of requiring full traffic management provisions to be put into place when access is required to the detector chamber, therefore reducing expense and inconvenience to road users, by minimising traffic disruptions.

Preferably, the hollow body, lid and detector holder of the detector chamber are composed of a non-ferrous material, such as aluminium. In this case, the hollow body, lid and detector holder may, more preferably, be composed of plastics.

Advantageously, this provides that a magnetic locator, such as a magnetometer, housed in the detector access chamber, can be utilised to locate ferromagnetic objects such as vehicles or cycles.

The hollow body of the detector access chamber may further comprise an externally protruding flange at the lower end of said hollow body to further improve the rigidity of the hollow body.

An externally protruding flange may also be beneficial, in that when the detector access chamber is installed in the road carriageway, it may assist in constricting or limiting the movement of the detector access chamber in the road carriageway and therefore helps limit the vibration of the detector access chamber.

Preferably, the hollow body may be approximately cylindrical in shape. Most preferably, the hollow body may be or substantially be frusto-conical in shape.

An approximately cylindrical shape, beneficially, may allow the detector access chamber to be installed easily in the carriageway with a core drill. A frusto-conical shape is advantageous in that it may assist with weight loading requirements.

The detector access chamber may further comprise a base, wherein said base is releasably engageable to the lower end of the hollow body. Preferably, the base may further comprise at least one locating tab, sized so as to be matingly engageable with at least one associated complementary connector on the lower end of the hollow body. Beneficially, this prevents rotation of the base independent of the hollow body. Optionally, the base may further comprise a drainage outlet therein, thereby allowing, for example, the drainage of any surface water and debris collected in the detector access chamber.

Beneficially, a base increases the volume of area on which the hollow body and lid seat and provides a surface for the detector holder to be mountable to. Optionally, the detector holder may be releasably engageable with the base. More preferably, the detector holder may be integrally formed as one piece with the base, surrounded by a retaining lip, to prevent rotation of the wireless directional detector held in the detector holder.

In one preferred embodiment, the detector holder comprises at least one detector retaining member, which projects upwardly towards the lid. Preferably the detector retaining member comprises a first and second portion, the first portion defining a shoulder for the wireless directional detector to seat thereon, and the second portion presenting an upright alignment element against which the wireless directional detector can be positioned and/or aligned.

Advantageously, this may allow the detector retaining member to help constrict or limit the wireless directional detector from reorientation and/or misalignment.

The hollow body may further comprise at least one inwardly projecting ledge on which the lid is seatable.

Ideally, the inwardly projecting ledge may form a continuous lip, upon which the lid is seatable.

Preferably, the lid may further comprise a tool receiving member adapted for receiving a tool, to assist with lifting the lid and disengaging said lid from the hollow body. Optionally, the tool receiving member may comprise an undercut channel cut at or adjacent to the side of the lid.

Preferably, the detector access chamber may further comprise a locking means associated with the lid to enable lockable engagement of the lid and hollow body. Optionally, this locking means may comprise a keyway formed in the lid to receive a tool for operating the locking mechanism, a tab cut in the underside of the lid which may further comprise a sunken area, to allow a lock tab to quarter turn, and a further aligned slot-like recess at or adjacent to the inwardly projecting ledge of the hollow body, sized so as to receive the lock tab, when a lock is engaged with the tool for operating the locking mechanism.

Optionally, the lid may be between 10 mm and 50 mm thick. More preferably, the lid may be between 20 mm and 40 mm thick. Most preferably the lid may be at least 30 mm thick. This may beneficially allow the lid to withstand 40 tonne wheel point load requirements.

Preferably, the lid may comprise text and/or directional marking, indicating the direction in which the detector access chamber and wireless directional detector should be facing.

According to a second aspect of the present invention, there is provided a submergible detector system for use in a road carriageway comprising a detector chamber in accordance with the first aspect of the invention, and a wireless directional detector having an upper and lower surface engaged with the detector holder so the upper surface of the wireless directional detector is or substantially is parallel to the upper end of the hollow body, the distance between the underside of the lid and an upper surface of the detector holder being less than the height of the wireless directional detector.

Such an arrangement constricts the movement of the detector inside the chamber. The detector is removably receivable within the detector holder. By the height of the wireless directional detector being greater than the distance between the underside of the lid and the upper surface of the detector holder, even if the detector does move in a vertical direction, due to vibrations of vehicles, the detector is prevented from dislodging and misaligning within the detector chamber.

Preferably, the distance between the underside of the lid and the upper surface of the detector holder may be significantly less than height of the detector.

Preferably, the distance between the underside of the lid and the upper surface of the wireless directional detector may be less than the distance between the shoulder of the first portion of the detector retaining member and the top of the second portion of the detector retaining member.

The invention will now be more particularly described, by way of example only, with reference to the accompanying drawings, in which.

Figure 1:
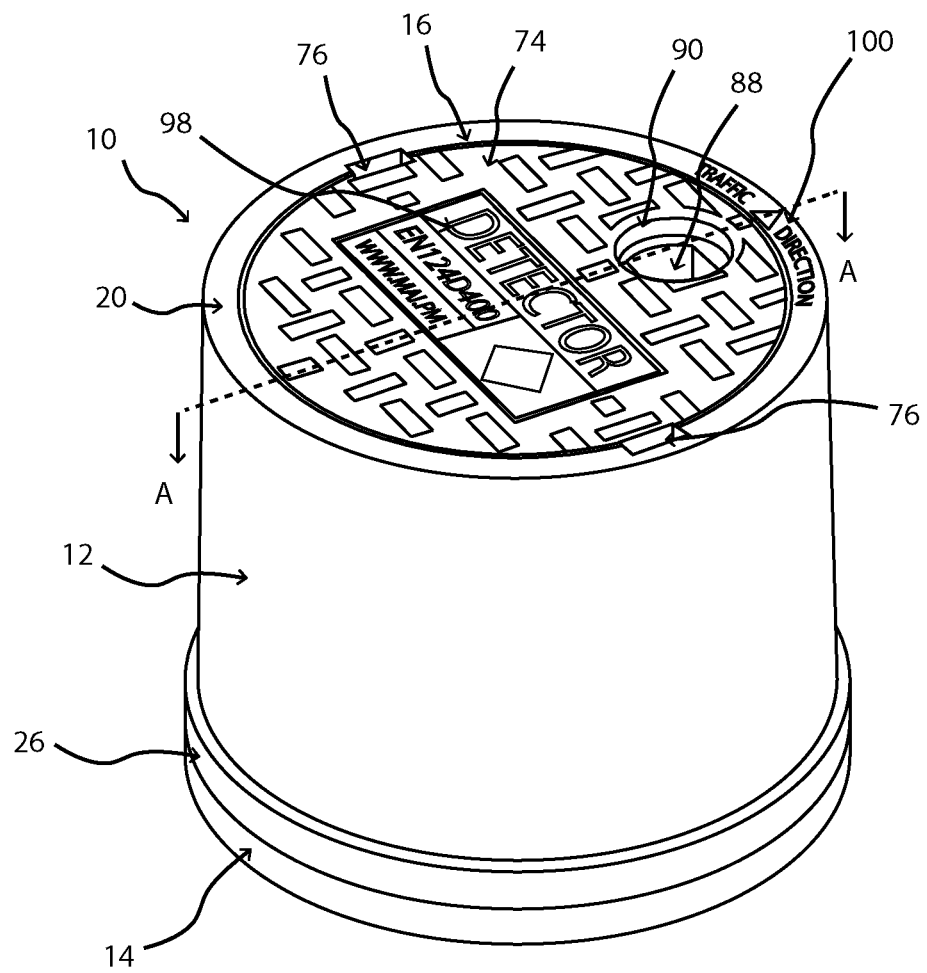
FIG. 1 shows a perspective view from above of one embodiment of a detector access chamber, in accordance with the first aspect of the invention.

Referring to the drawings, there is shown in FIG. 1, a detector access chamber 10 which comprises a hollow body 12, a base 14 and a lid 16. The hollow body 12 is preferably formed of non-ferrous material, preferably being moulded plastics, having a first access opening 18 at an open upper end 20 and a second access opening 22 at a lower opposing end 24. The hollow body 12 is preferably formed with an approximately frusto-conical shape, the diameter of the open upper end 20 being slightly less than the diameter of the lower opposing end 24, so as to assist with weight loading requirements.

Although the hollow body 12 is, in this case, frusto-conical in shape, other shapes are clearly feasible, such as a cylindrical, cuboidal or any such polyhedral prism and/or such other shapes that may taper from the open upper end towards the lower opposing end.

To improve the rigidity, preferably, the hollow body 12 may further comprise a flange or collar 26 at its lower end 24. In this case, the flange or collar 26 may be an integrally formed, externally protruding flange or collar 26, which extends laterally around the lower end 24 of the hollow body 12.

Although the flange or collar 26 is, in this case, continuous, it may be discontinuous and/or it may be a tooth or teeth, or alternatively another form of projection, such as a step or shoulder.

The flange or collar 26 gives structural support to the hollow body 12 and helps constrict or limit the detector access chamber 10 from vibrating or moving, when the detector access chamber 10 is cast into concrete, tarmac or other road surfacing material during installation.

The base 14 is preferably formed of non-ferrous materials, again, preferably being moulded plastics, and may preferably be of a similar or matching external circumference as the lower end 24 of the hollow body 12. Preferably, the base 14 may be releasably engageable with the lower end 24 of the hollow body 12.

Figure 2:
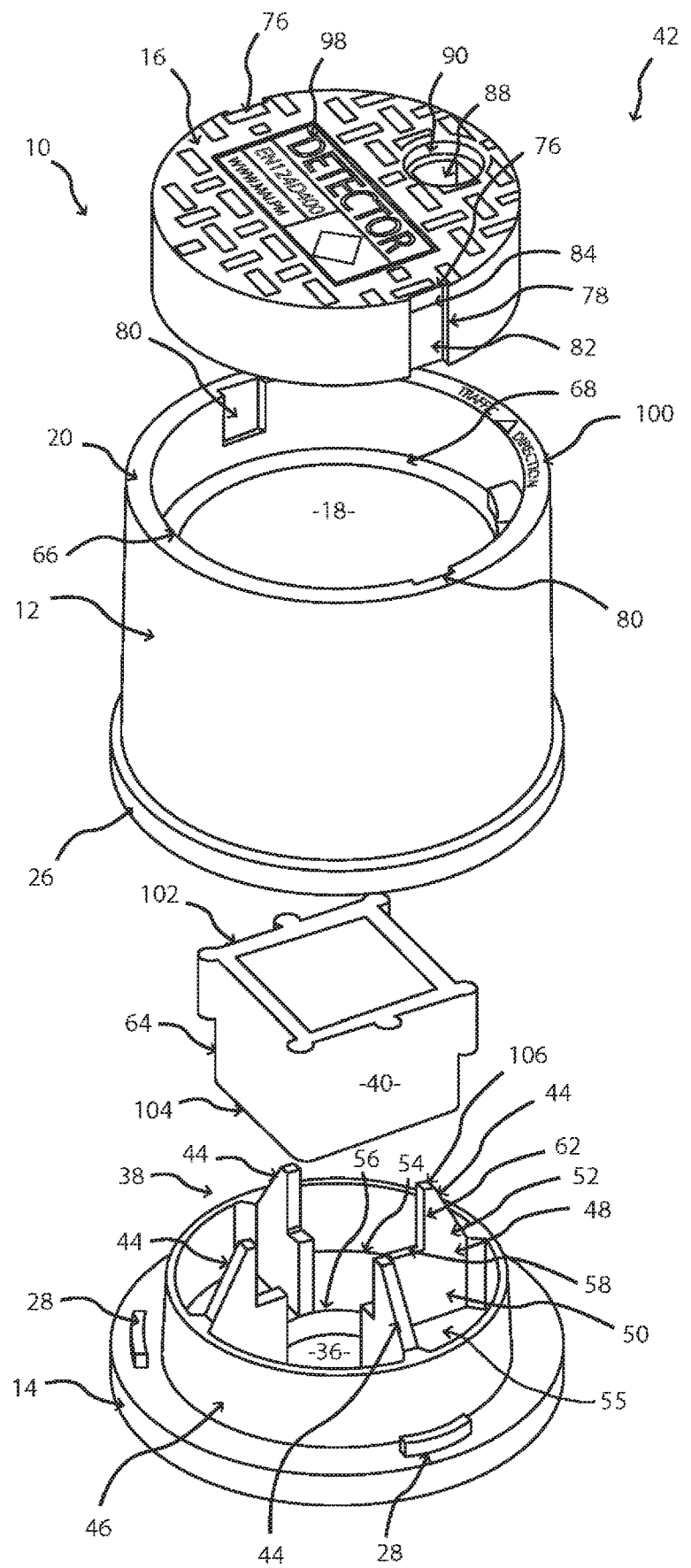
FIG. 2 shows an exploded perspective view of an embodiment of a submergible detector system in accordance with the second aspect of the invention, including a detector access chamber as shown in FIG. 1, with a magnetometer locatable within the detector access chamber.

The base 14 may further comprise locating tabs 28, sized so as to be matingly engageable with associated locating slots 30 on the lower end 24 of the hollow body 12. The locating tabs 28 may be positioned so as to oppose the flange or collar 26. The locating tabs 28 are preferably longitudinal and extend in a circumferential direction, protruding perpendicularly to the base 14, proximally towards the lower end 24 of the hollow body 12, as shown in FIG. 2.

Figure 4:
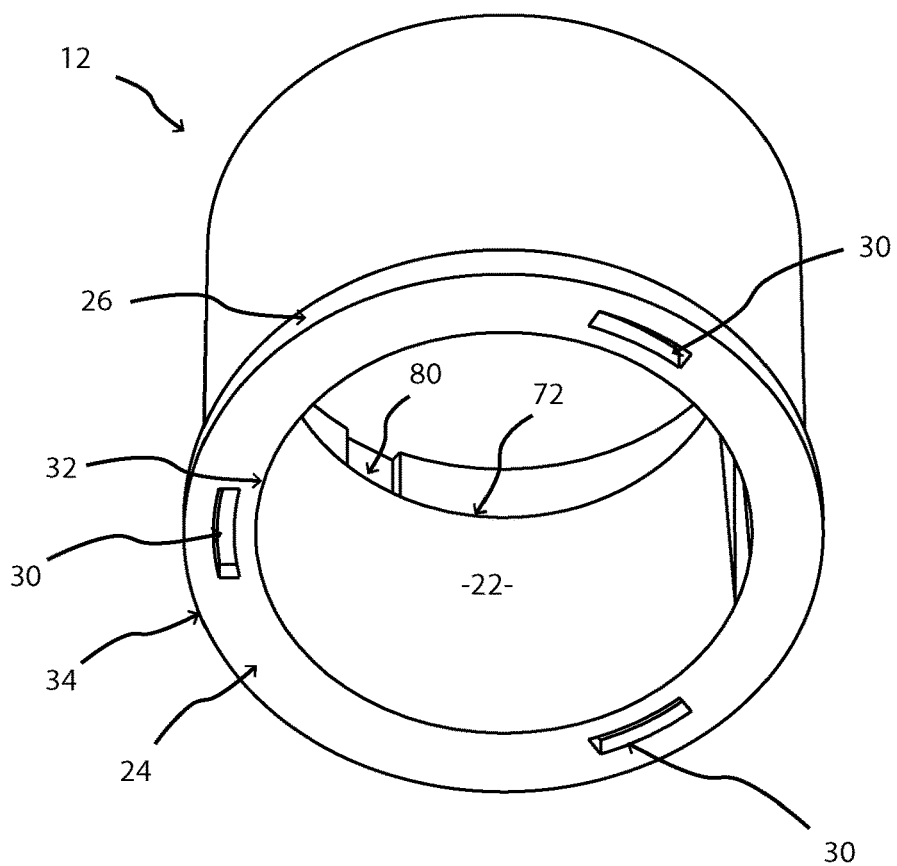
FIG. 4 shows a perspective view from below of a hollow body of the detector access chamber shown in FIG. 1.
Figure 5:
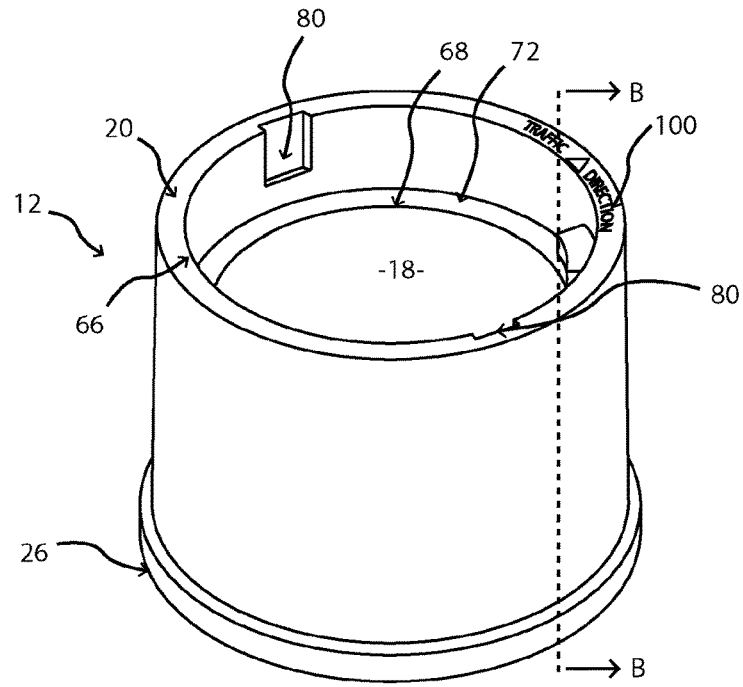
FIG. 5 shows a perspective from above of the hollow body shown in FIG. 4.
Figure 6:
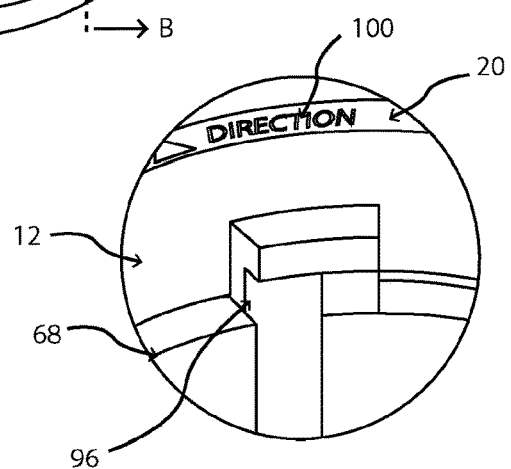
FIG. 6 is an enlarged view of a portion of the hollow body shown in FIG. 5, taken in the direction of line B-B extending in parallel with the top-to-bottom axis of the hollow body.
Figure 7:
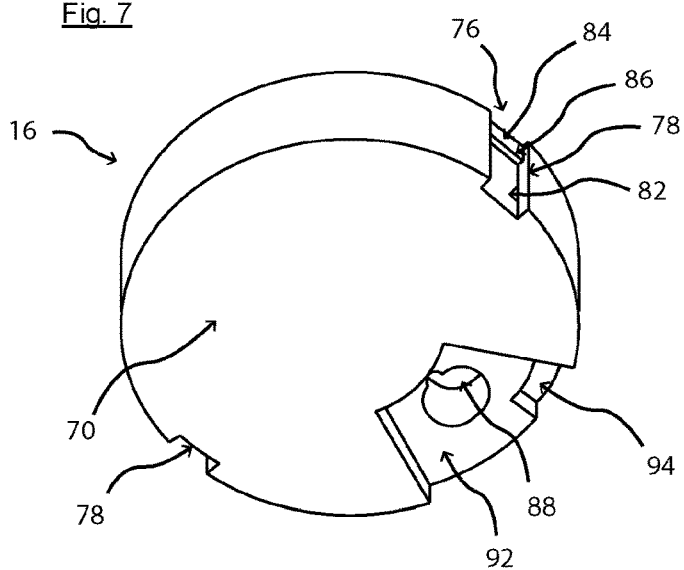
FIG. 7 shows a perspective view from below of a lid of the detector access chamber shown in FIG. 1.

The locating slots 30 are, in the depicted embodiment, elongate and extend in a circumferential direction, positioned so as to be spaced between the inner perimeter edge 32 and the outer perimeter edge 34 of the lower end 24 of the hollow body 12, as shown in FIG. 4.

Beneficially, the locating tabs 28 positioned on the base 14 will engage with the locating slots 30 on the lower end 24 of the hollow body 12, which is advantageous in preventing rotation of the base 14, independent of the hollow body 12.

Although the locating tabs 28 are, in this case, preferably elongate arcuate upstanding walls or ridges sized to match or substantially match the complementary locating slots 30, other kinds of locating elements may be utilised in addition and/or alternatively to the locating tabs 28 and complementary locating slots 30. For example, dimples, pins or other varieties of connectors may be utilised, such as a headed locking pin which can simply be dropped through respective apertures on the base and flange and/or the lower end of the hollow body once aligned. In addition, the locating tabs may be located on the lower end of the body and the locating slots on the base.

The base 14 may further comprise an approximately circular drainage outlet 36, located within the base 14, centrally for instance, as illustrated. Beneficially, this provides an exit channel through which any excess liquid can drain.

Although the depicted embodiment provides the drainage outlet 36 so as to be approximately circular and located within the centre of the base 14, it will be appreciated that a drainage outlet may be provided in a suitable form other than this. For example, the drainage outlet may comprise drill hole passageways, or alternatively, a mesh, a grid, or a spout may be utilised. In addition, the drainage outlet may be located off-centre of the base, or in the walls of the hollow body.

Figure 3:
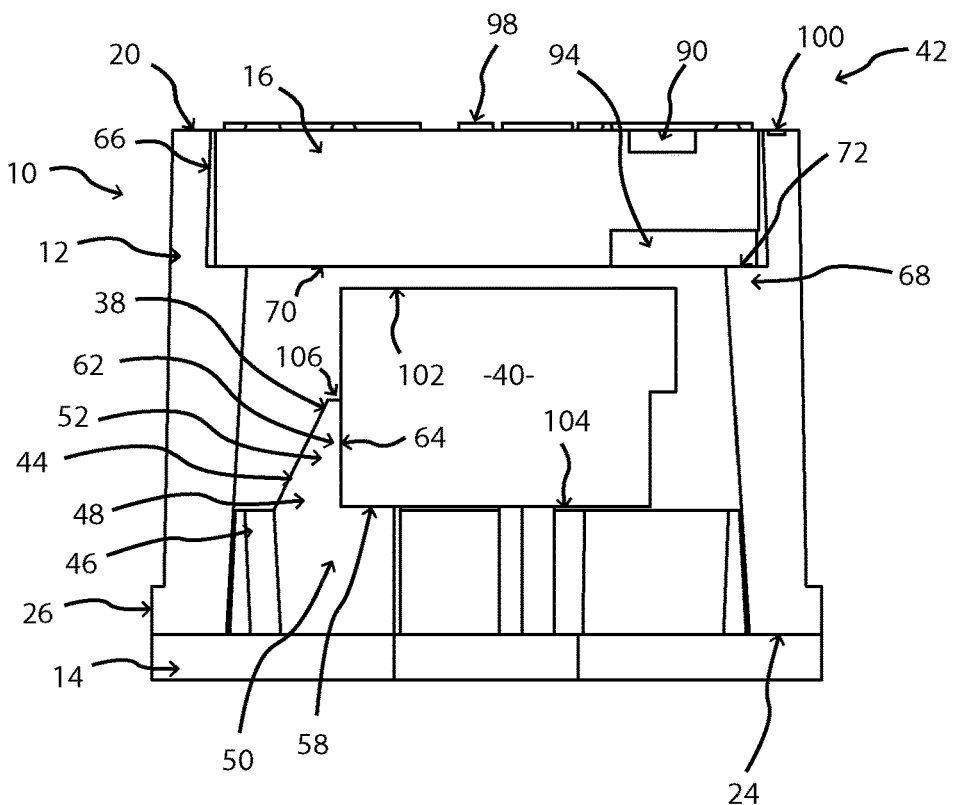
FIG. 3 shows a cross sectional view of an embodiment of a submergible detector system in accordance with the second aspect of the invention, taken along line A-A of the detector access chamber in FIG. 1, and showing the magnetometer located within the detector access chamber.

There is shown in FIGS. 2 and 3, a detector holder 38 which holds a wireless directional detector 40, such as a magnetometer, and which together with the detector access chamber 10 forms a submergible detector system 42.

The detector holder 38 is again preferably formed of non-ferrous materials, again beneficially being moulded plastics in this embodiment, and is preferably integrally formed as one piece with the base 14. Other configurations are clearly possible, such as the detector holder being releasably engageable with the base, or the detector holder being mountable via the base. The detector holder may also be attached to, or releasably engageable with the interior of the hollow body.

Preferably, the detector holder 38, includes at least one detector retaining member 44. In this embodiment there is shown a plurality of detector retaining members 44 being, preferably, at least partially enclosed within a contiguously formed lip 46 and projecting radially upwards from the base 14. Each detector retaining member 44 in this embodiment is in the form of an arm 48 which projects upwardly towards the lid 16. Beneficially, each arm 48 comprises two portions 50, 52, the first said portion 50 extending laterally from the interior diameter of the lip 54 to the outer perimeter 56 of the drainage outlet 36 and being wider than the second said portion 52, thereby defining a shoulder 58 for the wireless directional detector 40 to seat thereon so as to be raced from an internal base surface 55 of the base 14. The second portion 52 of the detector retaining member 44, being preferably contiguously formed, takes the form of an upright element 62, extending radially upwards, beyond the lip 46 and towards the lid 16, thereby forming an upright element 62 against which the wireless directional detector 40 can be positioned and/or aligned.

The detector holder 38 is dimensioned such that the upright elements 62 of the detector retaining members 44 are flush, or substantially flush with the outer surface of the walls 64 of the wireless directional detector 40. The shoulder portions 58 of the detector retaining members 44 are dimensioned such that the wireless directional detector 40 fits snugly into the volume defined by upright elements 62 and shoulder portions 58 of the detector retaining members 44, the upright elements 62 contacting or abutting or substantially abutting the outer surface of at least one exterior wall 64 of the wireless directional detector 40, when the wireless directional detector 40 is seated on the shoulder portion 58 of the detector retaining members 44.

While a specific embodiment of the detector holder is shown and described herein, it should be appreciated that this is not limited to any particular design, configuration or embodiment. For example, the detector holder could take the form of an open box seated on the base, or clips attached to the interior wall of the hollow body which the wireless directional detector may be engaged with. The lip, whilst adding rigidity, may be dispensed with. Furthermore, the detector holder may be provided with just one detector retaining member or more than that depicted and described.

The lid 16, as with the other parts, is preferably of non-ferrous materials, again conveniently being moulded plastics. The lid 16 is preferably of a similar external circumference to the inner perimeter 66 of the upper end 20 of the hollow body 12, thereby allowing the lid 16 to be releasably engageable with the upper end 20 of the hollow body 12.

It will be appreciated that the lid may also be permanently attached to the upper end of the hollow body, by means of a latch or hinge to allow the lid to pivot about the hinge or latch.

Preferably, the hollow body 12 may further comprise an inwardly projecting ledge 68 for an underside 70 of the lid 16 to seat thereon. In this case, the inwardly projecting ledge 68 is an integrally formed, internally protruding ledge 68, extending laterally around the circumference of the hollow body 12 and downwardly to the lower end 24 of the hollow body 12. The ledge 68 is located at a distance below the upper end 20 of the hollow body 12, such that that the upper surface 72 of the ledge 68 may be at a distance from the upper end 20 of the hollow body 12 that is approximately equal to the height of the lid 16. Consequently, when the lid 16 is seated on the inwardly projecting ledge 68 an upper surface 74 of the lid 16 is flush or approximately flush to the upper end 20 of the hollow body 12.

Although the ledge 68 is continuous, it may be discontinuous, forming a plurality of lips upon which the lid is seatable and/or it may be a tooth or teeth, or other forms of projection, such as a step or shoulder and need not extend to the lower end of the hollow body. It will also be appreciated that other means of engaging the lid and the hollow body may be utilised. For example, the lid may protrude above the hollow body and be attached by means of a hinge or latch. The ledge therefore, may be altogether dispensed with.

Preferably, the lid 16 may further comprise a tool receiving member 76 at or adjacent to the outer circumference of the lid 16, adapted for receiving a tool to assist with lifting the lid 16 and disengaging said lid 16 from the upper end 20 of the hollow body 12. In this embodiment, there is shown a plurality of tool receiving members 76, which here comprises two undercut channels 78, located approximately opposite each other, cut in a plane into the outer circumference of the side of the lid 16. Corresponding channels 80 are cut into the inner circumference of the upper end 20 of the hollow body 12. Each undercut channel 78 is arranged in two portions 82, 84, a first lower portion 82 of the undercut channel 78 in combination with the corresponding channel 80 cut into the hollow body 12 forming a recess to receive the tool, with a second portion 84 of the undercut channel 78 forming a sill 86 to allow an upward leverage to be applied by the tool to the underside of the sill 86, so as to assist with disengaging the lid 16 from the upper end 20 of the hollow body 12.

It is appreciated that other configurations of a tool receiving member may be utilised in addition and/or alternatively to an undercut channel located on the lid and corresponding channel located on the upper end of the hollow body. Such tool receiving members may be located in alternative locations on the lid and/or the hollow body.

The lid 16 may further include locking means to enable lockable engagement of the lid 16 and hollow body 12. The locking means may comprise a keyway 88 formed in the upper surface 74 of the lid 16 to receive a tool to operate the locking mechanism, which may comprise a further sunken housing 90 located within the upper surface 74 of the lid 16 above the keyway 88, of an appropriate diameter and depth to receive a lock head, a tab 92 cut in the underside 70 of the lid 16, which may further comprise a sunken area 94, sized so as to allow to allow a lock tab of a lock to turn in a rotational or pivotal movement through an arc of approximately 90°, and an aligned slot-like recess 96, at or adjacent to the inwardly projecting ledge 68 of the hollow body 12, specifically sized and adapted so as to receive the lock tab, when a lock is engaged with the tool for operating the locking mechanism.

While a specific embodiment of a quarter turn locking mechanism is shown and described herein, it should be appreciated by one of ordinary skill in the art that this invention is not limited to any particular design, configuration or embodiment. For example, a keyed lock mechanism, or cam locking mechanism may be utilised. Alternatively, a latching system may be used, or a headed locking pin which can simply be dropped through respective apertures on the lid and upper end of the hollow body once aligned.

The lid 16 is adapted such that the distance between the upper surface 74 of the lid 16 and the underside 70 of the lid 16 may be between 10 mm and 50 mm thick. Preferably, the distance between the upper surface 74 of the lid 16 and the underside 70 of the lid 16 may be between 20 mm and 40 mm thick. Most preferably, the distance between the upper surface 74 of the lid 16 and the underside 70 of the lid 16 may be at least 30 mm thick. Ideally, the lid 16 is also adapted so as to be able to be loaded with at least a 40 tonne wheel point load, thereby meeting BS EN 124 D400 requirements. This is the applicable British Standard in the UK for access covers capable of withstanding a 40 tonne static load test and advantageously, means the lid 16 is suitable for use in areas where cars and lorries have access, including carriageways, hard shoulders and pedestrian areas.

Preferably, the upper surface 74 of the lid 16 and/or upper surface 20 of the hollow body 12 may comprise text 98 and/or directional markings 100, protruding in raised projections from the upper surface 74 of the lid 16, indicating the direction in which the detector access chamber 10 and wireless directional detector 40, which together form the submergible detector system 42, should be aligned when installed in the road carriageway.

While a specific embodiment of a lid 16 is shown and described herein, it should be appreciated by one of ordinary skill in the art that this invention is not limited to any particular design, configuration or embodiment, provided such a lid is suitable for use in a road carriageway.

On installation of the detector access chamber 10 in a road carriageway, the detector access chamber 10 is cast into concrete such that the upper surface 74 of the lid 16 is flush, or substantially flush with the carriageway of the road, the detector access chamber 10 installed in such a configuration that a wireless directional detector 40 will be in its required planar alignment when engaged with the detector holder 38 in the detector access chamber 10. The wireless directional detector 40 has an upper 102 and lower surface 104 which are approximately parallel in relation to each other. On installation of the wireless directional detector 40 in the detector holder 38, the upper surface 102 of the wireless directional detector 40 is approximately parallel to the upper end 20 of the hollow body 12.

When the lid 16 is seated on the radially inwardly projecting ledge 68, it is preferable that the distance between the underside 70 of the lid 16 and the upper surface of the detector holder 38, in this embodiment, a top 106 of the upright elements 62, may be dimensioned so as to be less than the distance between the upper 102 and lower surface 104 of the wireless directional detector 40.

It is therefore possible to provide a detector access chamber which can be easily installed, located and accessed by an installer and/or road repairer. The detector access chamber can accommodate vehicle loads which have hereto before been unattainable, thereby improving the longevity of the installed detector. The wireless directional detector can be simply and safely accommodated within the detector access chamber, simply by lifting the cover and extracting the wireless directional detector and/or dropping the wireless directional detector in, typically by hand. It is also possible to utilise the load bearing lid to restrict undesirable internal reorientation of the installed wireless directional detector. By providing the holding chamber with a detector holder positioned below the lid to thereby define a specific distance therebetween and internal detector housing volume, the wireless directional detector held by the detector holder is limited in its vertical, translational and rotational movement, thereby preventing or inhibiting reorientation due to vehicular vibration.

The words 'comprises/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of examples only, and various other modifications will be apparent to persons skilled in the field without departing from the scope of the invention herein described and defined.

The invention claimed is:

1. A detector access chamber for a wireless directional detector, comprising:
    a hollow body having an open upper end and a lower end at an opposing end;
    a lid engageable with the open upper end of the hollow body; and
    a detector holder associated with the hollow body to hold a wireless directional detector,
    the lid and the detector holder defining a volume adapted to constrain an orientation of the wireless directional detector,
    further comprising a base;

wherein the detector holder is provided on the base, and the detector holder comprises at least one detector retaining member which projects upwardly towards the lid, the detector retaining member comprising a first portion and a second portion, the first portion defining a shoulder for the wireless directional detector to seat thereon so as to be spaced from an internal base surface of the base, and the second portion presenting an upright alignment element against which the wireless directional detector can be positioned and/or aligned; and wherein the detector access chamber is installed in a road carriageway.

2. The detector access chamber as claimed in claim 1, wherein the hollow body, lid and detector holder are composed of a non-ferrous material and/or of plastics.

3. The detector access chamber as claimed in claim 1, wherein the lower end of the hollow body further comprises an externally protruding flange.

4. The detector access chamber as claimed in claim 1, wherein the hollow body is frusto-conical in shape.

5. The detector access chamber as claimed in claim 1, wherein the base further comprises a drainage outlet therein to permit drainage of liquid from the internal base surface.

6. The detector access chamber as claimed in claim 1, wherein the detector holder is mountable via the base.

7. The detector access chamber as claimed in claim 6, wherein the detector holder is releasably engageable with the base.

8. The detector access chamber as claimed in claim 6, wherein the detector holder is integrally formed as one piece with the base.

9. The detector access chamber as claimed in claim 1, wherein the hollow body further comprises at least one inwardly projecting ledge on which the lid is seatable.

10. The detector access chamber as claimed in claim 9, wherein the lid further comprises a tool receiving member, adapted for receiving a tool, to assist with lifting the lid and disengaging said lid from the hollow body.

11. The detector access chamber as claimed in claim 9, wherein the tool receiving member comprises an undercut channel cut at or adjacent to the side of the lid.

12. The detector access chamber as claimed in claim 1, further comprising a lock associated with the lid to enable lockable engagement of the lid and hollow body.

13. The detector access chamber as claimed in claim 1, wherein the lid is at least 30 mm thick.

14. The detector access chamber as claimed in claim 1, wherein the lid further comprises text and/or directional marking, indicating the direction in which the detector access chamber and wireless directional detector should be facing.

15. A submergible detector system for use in a road carriageway comprising:

the detector access chamber as claimed in claim 1; and the wireless directional detector having an upper and lower surface, the wireless directional detector engaged with the detector holder, so the upper surface of the wireless directional detector is or substantially is parallel to the open upper end of the hollow body, a distance between an underside of the lid and an upper surface of the detector holder being less than the height of the wireless directional detector.

16. The submergible detector system as claimed in claim 15, wherein a distance between the underside of the lid and the upper surface of the wireless directional detector is less than a distance between the shoulder of the first portion of the detector retaining member and a top of the second portion of the detector retaining member.

17. The detector access chamber as claimed in claim 1, wherein the base is releasably engagable with the lower end of the hollow body.

18. The detector access chamber as claimed in claim 1, wherein the base further comprises at least one locating tab, sized so as to be matingly engagable with at least one associated complementary connector on the lower end of the hollow body, in use, the or each locating tab thereby preventing rotation of the base.

* * * * *